(12) United States Patent
Park (10) Patent No.: US 7,301,374 B2
(45) Date of Patent: Nov. 27, 2007

(54) CHIP FOR OPERATING IN MULTI POWER CONDITIONS AND SYSTEM HAVING THE SAME

(75) Inventor: Hong-Joo Park, Chungcheongbuk-do (KR)

(73) Assignee: MagnaChip Semicondutor, Ltd., Chuncheongbuk-do (KR)

( * ) Notice: Subject to any disclaimer, the term of this patent is extended or adjusted under 35 U.S.C. 154(b) by 107 days.

(21) Appl. No.: 11/319,562

(22) Filed: Dec. 29, 2005

(65) Prior Publication Data

US 2006/0186929 A1 Aug. 24, 2006

(30) Foreign Application Priority Data

Feb. 18, 2005 (KR) ...................... 10-2005-0013582

(51) Int. Cl.
*H03K 5/22* (2006.01)
(52) U.S. Cl. .................... 327/77; 327/143; 327/333

(58) Field of Classification Search ............... 326/80, 326/81; 327/77, 143, 198, 318, 319, 333
See application file for complete search history.

(56) References Cited

U.S. PATENT DOCUMENTS 5,894,423 A * 4/1999 Ling et al. .................. 700/293
6,759,872 B2 * 7/2004 Lai et al. ...................... 326/81

* cited by examiner

*Primary Examiner*—Jeffrey Zweizig
(74) *Attorney, Agent, or Firm*—Morgan, Lewis & Bockius LLP (57) ABSTRACT

An apparatus for controlling an I/O interface of a chip operated in multi-power conditions includes an enable signal generator for generating an enable signal based on a chip power down signal; a reference voltage generator for generating a predetermined reference voltage in response to the enable signal; a comparator for determining a voltage required for operating the chip by comparing an external power voltage with the reference voltage in response to the enable signal; and an input/output means for performing an I/O interface function based on the voltage determined according to the comparison result of the comparator.

13 Claims, 7 Drawing Sheets

CHIP FOR OPERATING IN MULTI POWER CONDITIONS AND SYSTEM HAVING THE SAME

FIELD OF THE INVENTION

The present invention relates to a chip having a comparator; and, more particularly, to a chip having a comparator for operating in multi-power conditions with low power consumption through an auto-off function, and a system having the same.

DESCRIPTION OF RELATED ART

When installing image sensor chips on mobile phones or the like, there may occur a problem in an interface function if a power voltage used for an internal chip of the mobile phone having a function of interfacing with the image sensor chip is different from a power voltage used for an interface of the image sensor chip. Therefore, it is necessary for the power voltage to be controlled such that the same power voltage should be used at the interface of the two chips.

Figure 1:
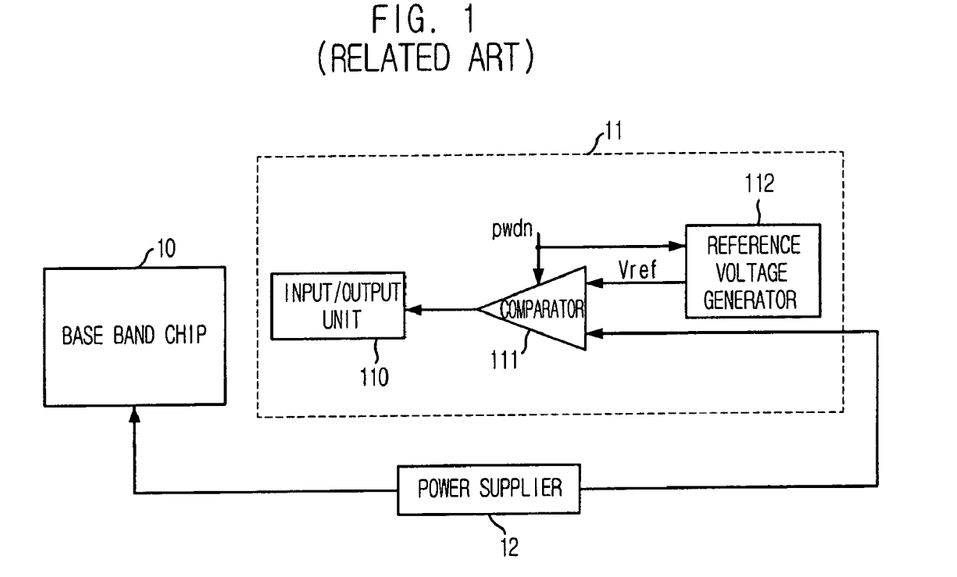
FIG. 1 is a block diagram setting forth a conventional system having a chip with a multi-power selective function.

FIG. 1 is a block diagram setting forth a conventional system having a chip with a multi-power selective function.

Referring to FIG. 1, the conventional system includes a base band chip 10, a chip 11 such as an image sensor chip interfaced with the base band chip 10 for performing a predetermined operation, and a power supplier 12 for supplying the base band chip 10 and the image sensor chip 11 with a multi-power.

The image sensor chip 11 includes a reference voltage generator 112 for generating a reference voltage VREF, a comparator 111 and an input/output unit 110. Herein, the comparator 111 compares the power voltage supplied from the power supplier 12 with the reference voltage VREF, and determines a power voltage which will be used for the interface and the image sensor chip 11 according to the comparison result. The input/output unit 110 performs the function of interfacing with the base band chip 10 using the power voltage determined by the comparison result of the comparator 111.

While the image sensor chip 11 may further include a sensing unit for generating an image signal besides the above constitutions, it is omitted for the sake of conciseness.

The conventional system of FIG. 1 incorporates the image sensor chip 11 with multi input/output functions, in which a chip power down signal PWDN is intactly used for the comparison operation of the comparator 111. That is, both the comparator 111 and the reference voltage generator 112 operate in response to the chip power down signal PWDN.

Therefore, the comparator 111 is always turned on while the chip is operating, which causes the unnecessary power consumption to occur in the conventional system. Meanwhile, since the current consumption in the comparator 111 is about 50 µA, the current as much as about 50 µA is unnecessarily and inevitably consumed on and on in the comparator 111 while the chip is operating.

However, after the comparison operation, the comparator 111 may be turned off. Thus, it is required for developing a new system for automatically turning off the comparator 111 after the comparison operation has been completed, in order to reduce unnecessary power consumption.

SUMMARY OF THE INVENTION

It is, therefore, an object of the present invention to provide a chip for operating in multi-power conditions capable of reducing power consumption by designing a comparator and a reference voltage generator with an auto-off function, and a system having the chip.

In accordance with an aspect of the present invention, there is provided an apparatus for controlling an I/O interface of a chip operated in multi-power conditions, including: an enable signal generator for generating an enable signal based on a chip power down signal; a reference voltage generator for generating a predetermined reference voltage in response to the enable signal; a comparator for determining a voltage required for operating the chip by comparing an external power voltage with the reference voltage in response to the enable signal; and an input/output means for performing an I/O interface function based on the voltage determined according to the comparison result of the comparator.

In accordance with another aspect of the present invention, there is provided a system including: a power supplier for supplying a multi-power; a first chip for operating using the power supplied from the power supplier; and a second chip for comparing an internal reference voltage with the power supplied from the power supplier to determine a voltage for the first and the second chips, the second chip operating to interface with the first chip by using the determined voltage, wherein the second chip includes: an enable signal generator for generating an enable signal using a chip power down signal; a reference voltage generator for generating a predetermined reference voltage in response to the enable signal; a comparator for storing the enable signal for a predetermined time and determining a voltage required for operating the chip by comparing the reference voltage with an external power voltage in response to the enable signal during the predetermined time, the comparator being automatically turned off after a lapse of the predetermined time; and an input/output means for performing an interface function using the voltage determined according to the comparison result of the comparator.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A chip for operating in multi-power conditions and a system having the same in accordance with exemplary embodiments of the present invention will be described in detail with reference to the accompanying drawings.

Figure 2:
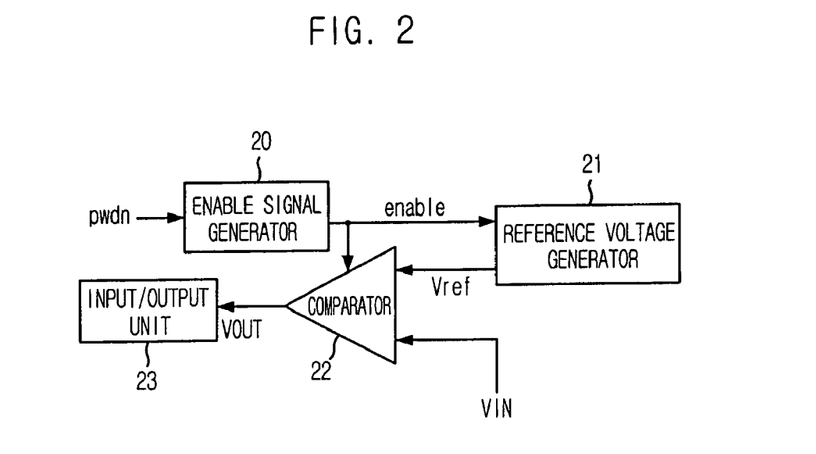
FIG. 2 is a block diagram of a chip with a multi-power selective function in accordance with an embodiment of the present invention.

FIG. 2 is a block diagram of a chip with a multi-power selective function in accordance with an embodiment of the present invention.

Referring to FIG. 2, the chip for operating in multi-power conditions, includes an enable signal generator 20, a reference voltage generator 21, a comparator 22, and an input/output unit 23. Herein, the enable signal generator 20 generates an enable signal ENABLE using a chip power down signal PWDN. The reference voltage generator 21 generates a reference voltage VREF in response to the enable signal ENABLE. The comparator 22 stores the enable signal ENABEL for a predetermined time, and determines a voltage required for operating the chip by comparing an external power voltage with the reference voltage VREF in response to the enable signal ENABLE for the predetermined time. On the contrary, after a lapse of the predetermined time that the enable signal ENABLE is being activated, the comparator 22 is automatically turned off. The input/output unit 23 performs an interface function using the voltage determined by the comparison result of the comparator 22.

While the image sensor chip may further include a sensing unit for generating an image signal besides the above constitutions, it is omitted for the sake of conciseness.

In comparison with the conventional image sensor chip of FIG. 1, the image sensor chip of the present invention further includes the enable signal generator 20 for reducing power consumption that is severe problem in the conventional one.

Figure 3A:
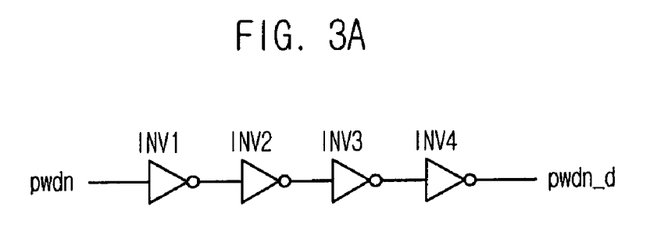
FIGS. 3A to 3C are circuit diagrams and a timing diagram setting forth an enable signal generator and its operation.
Figure 3B:
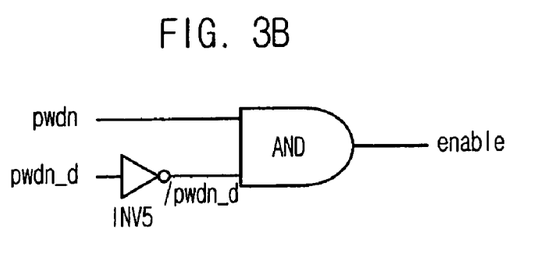
Figure 3C:
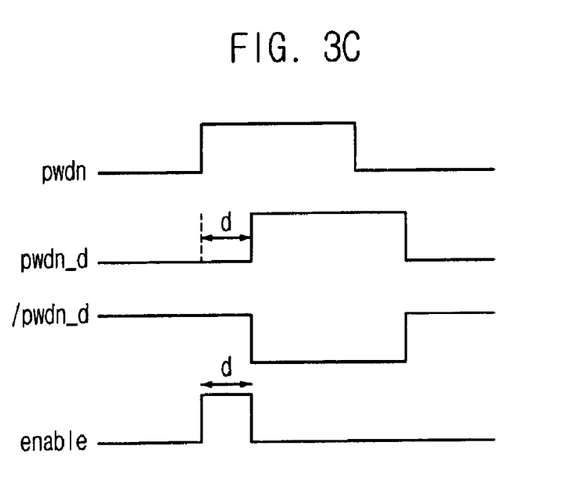

FIGS. 3A to 3C are circuit diagrams and a timing diagram setting forth the enable signal generator 20 and its operation.

Referring to FIG. 3A, it is shown that the chip power down signal PWDN is delayed while passing through four inverters INV1 to INV4 so that a delayed power down signal PWDN_D is generated. Herein, although there are employed the four inverters INV1 to INV4 for generating the in-phase delayed power down signal PWDN_D, there may be employed an even number of inverters to generate an in-phase delayed power down signal PWDN-N instead of the four inverters.

Referring to FIG. 3C, it is a timing diagram illustrating the enable signal ENABLE. The enable signal ENABLE is generated by performing a predetermined operation on the chip power down signal PWDN and the delayed power down signal PWDN_D. Herein, the enable signal ENABLE maintains its logic high level during the delayed time d.

That is, since the enable signal ENABLE is deactivated regardless of the chip power down signal PWDN after a predetermined time, i.e., the delayed time d, it is possible to reduce the unnecessary power consumption by automatically turning off the comparator 22 and the reference voltage generator 21 when using the enable signal ENABEL as a control signal of the comparator 22 and the reference voltage generator 21.

Referring to FIG. 3B, there is shown a circuit diagram of the enable signal generator 20 in accordance with an embodiment. The enable signal generator 20 is configured with an inverter INV5 for inverting the delayed power down signal PWDN_D to output the delayed power down bar signal/PWDN_D, and an AND gate performing a logic AND operation on the chip power down signal PWDN and the delayed power down bar signal/PWDN_D to output the enable signal ENABLE.

In order to constitute the comparator 22 with low power consumption, there is employed a latch having a memory function in the present invention.

Figure 4:
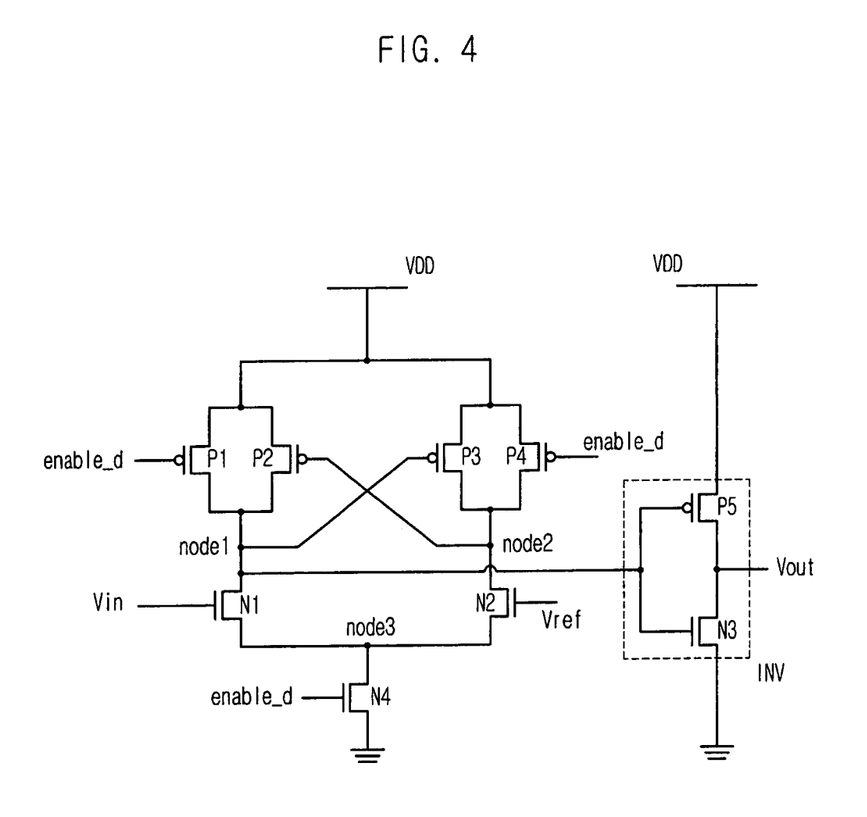
FIG. 4 is a circuit diagram of a comparator in accordance with an embodiment of the present invention.

FIG. 4 is a circuit diagram of a comparator in accordance with an embodiment of the present invention.

Referring to FIG. 4, the comparator 22 includes a plurality of PMOS transistors P1, P2, P3 and P4, a plurality of NMOS transistors N1 and N2, and an inverter INV. Herein, although an enable signal ENABLE_D is a signal that an actual enable signal is delayed for a certain delay time, it will be defined as the enable signal ENABLE_D for the sake of illustrative convenience. The PMOS transistor P1 of which a gate is controlled through the enable signal ENABLE_D is connected between a power voltage VDD and a first node NODE1. The PMOS transistor P2 is connected in parallel with the PMOS transistor P1 and a gate is connected to a second node NODE2. The PMOS transistor P4 of which a gate is controlled through the enable signal ENABLE_D is connected between the power voltage VDD and the second node NODE2. The PMOS transistor P3 is connected to the PMOS transistor P4 in parallel and a gate is connected to the first node NODE1. The NMOS transistor N1 receives an external power voltage VIN through a gate thereof and it is connected between the first node NODE1 and a third node NODE3. The NMOS transistor N2 receives the reference voltage VREF through a gate thereof and it is connected between the second node NODE2 and the third node NODE3. The NMOS transistor N4 of which a gate is controlled through the enable signal ENABLE_D is connected between the third node NODE3 and the ground voltage VSS. Meanwhile, the inverter INV inverts the signal of the first node NODE1.

The inverter INV is configured with a PMOS transistor P5 and an NMOS transistor N3 which are connected to each other in series between the power voltage VDD and the ground voltage VSS. Both MOS transistors P5 and N3 receive the signal of the first node NODE1 through each gate.

The NMOS transistor N4 is used for implementing a low power performance when the comparator 22 operates, while the PMOS transistors P1 and P2 are used for a power-down during an unnecessary operation.

The comparator 22 having the above structure is configured in a latch structure so as to store its output value VOUT. There is a lot of power consumption at a first comparison operation, but afterwards, the comparator 22 of the present invention shows an advantage that the power consumption is relatively low and further its response speed is high with respect to any reference voltage VREF.

Because the amount of current flowing via the comparator 22 may be controlled by adjusting a width-to-length ratio of the NMOS transistor N4, it is possible to control the amount of current flowing via the comparator 22 with ease through the above method. In addition to this, the NMOS transistor N4 receives the enable signal ENABLE_D through the gate thereof so that it plays a role in turning off the comparator 22 in whole during the unnecessary operation.

The PMOS transistors P1 and P4 are turned on in coincidence with the power-off of the comparator 22 so that they act as resetting the comparator 22. That is, since the first and the second nodes NODE1 and NODE2 maintain almost the power voltage VDD level when the PMOS transistors P1 and P4 are turned on, the PMOS transistors P2 and P3 are turned off so that the comparator 22 is turned off after all. As a result, there is no unnecessary power consumption. This case is that the enable signal ENABLE_D is in logic low level, i.e., deactivated.

When the enable signal ENABLE_D is in logic high level, the PMOS transistors P1 and P4 are turned off and the PMOS transistors P2 and P3 are turned off. In addition, the NMOS transistor N4 is turned on.

If the external power voltage VIN is larger than the reference voltage VREF, the level of the first node NODE1 becomes smaller than that of the second node NODE2 because the NMOS transistor N1 is strongly turned on in comparison with the NMOS transistor N2. As a result, the PMOS transistor P3 is strongly turned on in comparison with the PMOS transistor P2. Therefore, the first node NODE1 has a logic level 0, whereas the output value VOUT of the comparator 22 has a logic level 1.

On the contrary, if the reference voltage VREF is larger than the external power voltage VIN, the level of the second node NODE2 becomes smaller than that of the first node NODE1 because the NMOS transistor N2 is strongly turned on in comparison with the NMOS transistor N1. Accordingly, the PMOS transistor P2 is strongly turned on in comparison with the PMOS transistor P3. Therefore, the first node NODE1 has a logic level 1, whereas the output value has a logic 0 level.

The comparator 22 is configured in a latch structure as if two inverters are connected to each other in series so that the comparator 22 is automatically turned off after latching the data for the time being.

Compared with the prior art, the chip power down signal PWDN is directly applied to three transistors P1, P4 and N4 in the conventional comparator so that the comparator is continuously turned on after the comparison operation, whereas the enable signal which is only activated for the predetermined time is applied to the transistors P1, P4 and N4 instead of the power down signal PWDN so that the inventive comparator 22 is only turned on during the comparison operation and automatically is turned off besides the comparison operation. As a result, the present invention is effective for reducing unnecessary power consumption.

Figure 7:
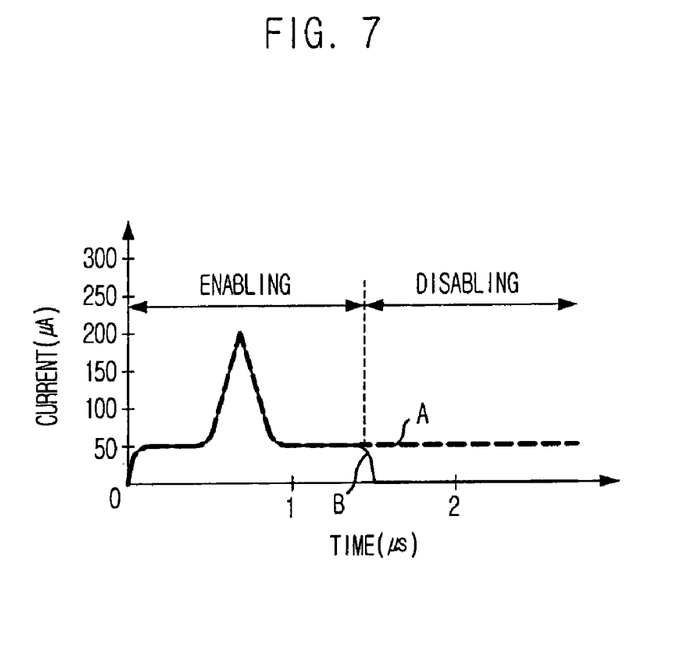
FIG. 7 is a graph of power consumption comparing the system of the present invention with the conventional system.

FIG. 7 is a graph of power consumption comparing the system of the present invention with the conventional system.

Referring to FIG. 7, it is understood that the current is unnecessarily consumed as much as about 500 μA after the actual operation of the comparator 22 has been completed in the conventional comparator 22, which is denoted as a doted line A. On the contrary, while the inventive comparator is similar in current consumption to the conventional one during the activation period of the enable signal ENNABLE_D, the current is rarely consumed when the enable signal ENABLE_D is deactivated, i.e., the comparison operation of the comparator 22 is completed.

Figure 5:
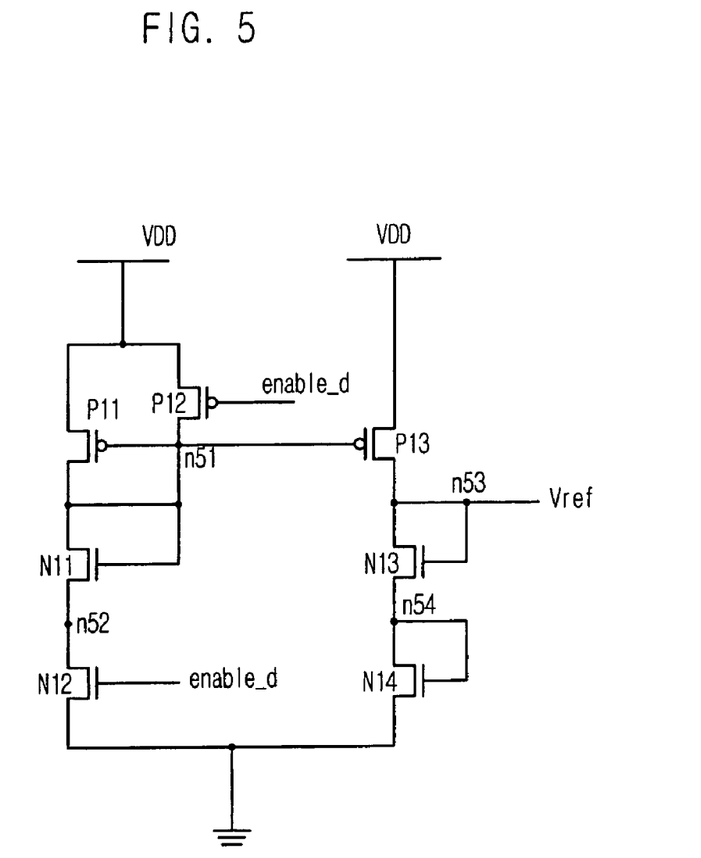
FIG. 5 is a circuit diagram of a reference voltage generator in accordance with an embodiment of the present invention.

FIG. 5 is a circuit diagram of the reference voltage generator 21 in accordance with an embodiment of the present invention.

Referring to FIG. 5, the reference voltage generator 21 includes a plurality of PMOS transistors P11, P12 and P13, and a plurality of NMOS transistors N11, N12, N13 and N14. Herein, the PMOS transistor P12 of which a gate is controlled by the enable signal ENABLE_D is connected between a power voltage VDD and a first node N51. The PMOS transistor P11 of which a gate is connected to the first node N51, is connected between the power voltage VDD and the first node N51. The NMOS transistor N11 of which a gate is connected to the first node N51, is connected between the first node N51 and a second node N52. The NMOS transistor N12 of which a gate is controlled by the enable signal ENABLE_D, is connected between the second node N52 and the ground voltage VSS. The PMOS transistor P13 of which a gate is connected to the first node N51, is connected to the power voltage VDD and a third node N53, wherein the reference voltage VREF is outputted through the third node N53. The NMOS transistor N13 of which a gate is connected to the third node N53, is connected between the third node N53 and a fourth node N54. The NMOS transistor N14 of which a gate is connected to the fourth node N54, is connected between the fourth node N54 and the ground voltage VSS.

In configuring the reference voltage generator 21 with resistors, there is a problem that a size is too large. Whereas, in case of configuring the reference voltage generator 21 with diodes, there is a demerit that a predetermined voltage less than a voltage difference VDD-Vt between the power voltage VDD and the threshold voltage Vt, should be used.

In accordance with the present invention, in order to satisfy demands of low power performance and small layout size, the PMOS transistors P11 and P13 have a structure similar to a current mirror configuration. Therefore, by adjusting the width to length ratio of each transistor, it is possible to set a desired voltage level, e.g., 2.3 V.

An operation of the reference voltage generator 21 with the above structure will be set forth herebelow.

When the reference voltage generator 21 is disabled, the PMOS transistor P12 is turned on. That is, since the enable signal ENABLE_D is in logic low level, the PMOS transistor P12 is turned on. Therefore, a level of the first node N51 becomes almost the level of the power voltage VDD. Furthermore, the NMOS transistor N11 is turned on but the NMOS transistor N12 is turned off because the enable signal is in logic low level. As a result, the reference voltage VREF is not outputted in this case.

Meanwhile, when the enable signal ENABLE_D becomes logic high level, the PMOS transistor P12 is turned off. On the contrary, the PMOS transistor P11 and the NMOS transistor N12 are turned on so that a certain current flows from the power voltage VDD into the ground VSS via the transistors P11, N11 and N12. Since the gates of the PMOS transistors P11 and P13 are commonly connected so that they configure the current mirror, the certain current also flows via the PMOS transistor P13. At last, the voltage level of the third node N53 becomes the reference voltage VREF corresponding to a voltage drop across the diode connected NMOS transistors N13 and N14.

Figure 6:
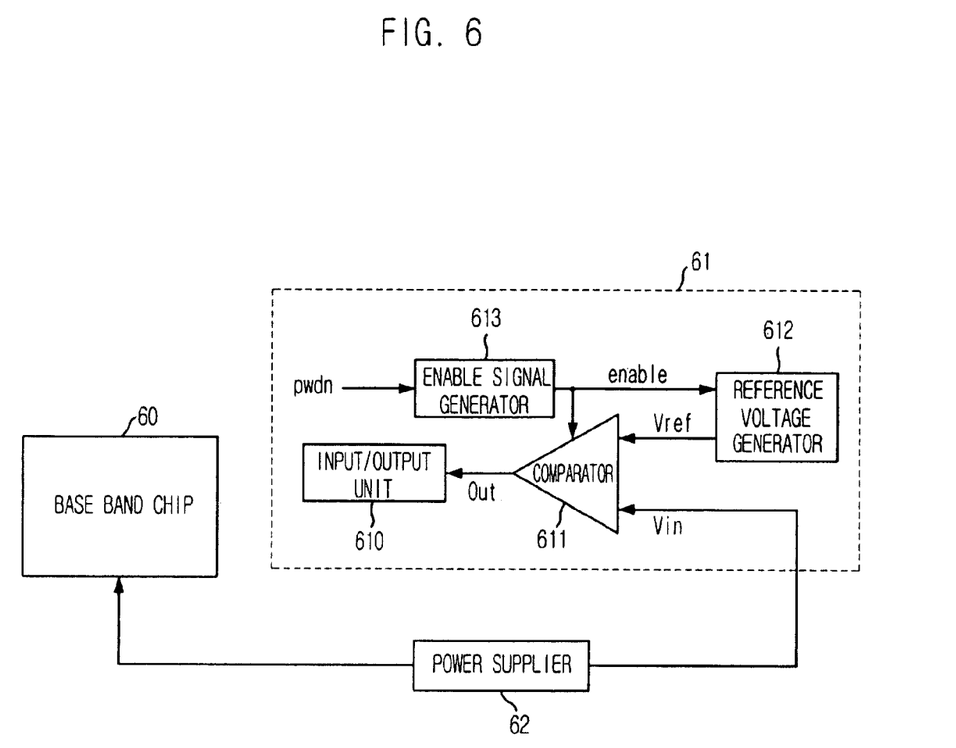
FIG. 6 is a block diagram setting forth a system having the chip with the multi-power selective function in accordance with an embodiment of the present invention.

FIG. 6 is a block diagram setting forth a system having the chip with the multi-power selective function in accordance with an embodiment of the present invention.

Referring to FIG. 6, the system of the present invention includes a power supplier 62 for supplying a multi-power, a first chip such as a base band chip 60 operating using the power supplied from the power supplier 62, and a second chip such as an image sensor chip 61. The image sensor chip 61 compares the power voltage supplied from the power supplier with the reference voltage VREF to determine the voltage for the base band and the image sensor chips 60 and 61. Thereafter, the image sensor chip 61 operates using the determined voltage while interfacing with the base band chip 60.

Since the image sensor chip 61 has the constitution of FIG. 2 in which only reference numerals are denoted differently, and its detail constitutions are also similar to those described in FIGS. 3 to 5, further detail illustrations for the constitution and the operation will be omitted, herein.

If the system constitution of FIG. 6 is an internal structure of a mobile phone, the power supplier 62 is contained in a border of the mobile phone, which supplies the multi-voltage. This multi-voltage is provided to both the base band chip 60 and the comparator 611 in the image sensor chip 61. Thus, the multi-voltage inputted to the comparator 611 is compared with the reference voltage VREF so that the comparator 611 outputs a predetermined digital data, i.e., 0 or 1. Then, the outputted digital data is inputted to the input/output unit 610. For instance, if the outputted digital data is 1, the digital data is provided to a switch such that the voltage of the input/output unit 610 becomes 2.5 V. At this time, a driving current is also determined.

Adversely, when the outputted digital data is 0, the digital data is provided to the switch such that the voltage of the input/output unit 610 becomes 1.8 V, and thus, a driving current is also determined corresponding to the voltage.

Figure 8:
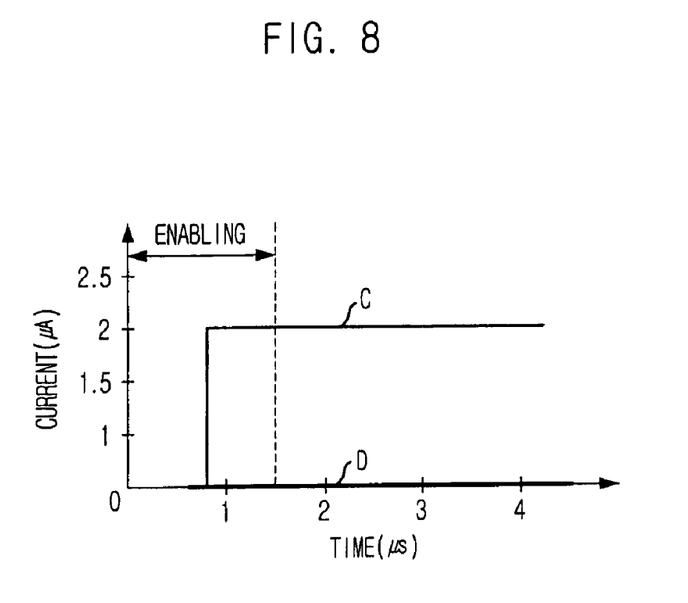
FIG. 8 is a timing diagram representing a simulation result of the system when the input is 1.8 V in accordance with the present invention.

FIG. 8 is a timing diagram representing a simulation result of the system when the input is 1.8 V in accordance with the present invention.

Herein, an abscissa axis represents a time in micro-second (μs), and an ordinate axis represents a voltage in volt (V). In addition, two lines C and D denote the power inputted to the comparator and the digital data outputted from the comparator, respectively. In FIG. 8, it is understood that the digital data outputted from the comparator is 0 in case that the input is 1.8 V. An enabling period indicates the period that the enable signal ENABLE_D is in logic high level, i.e., activated.

Figure 9:
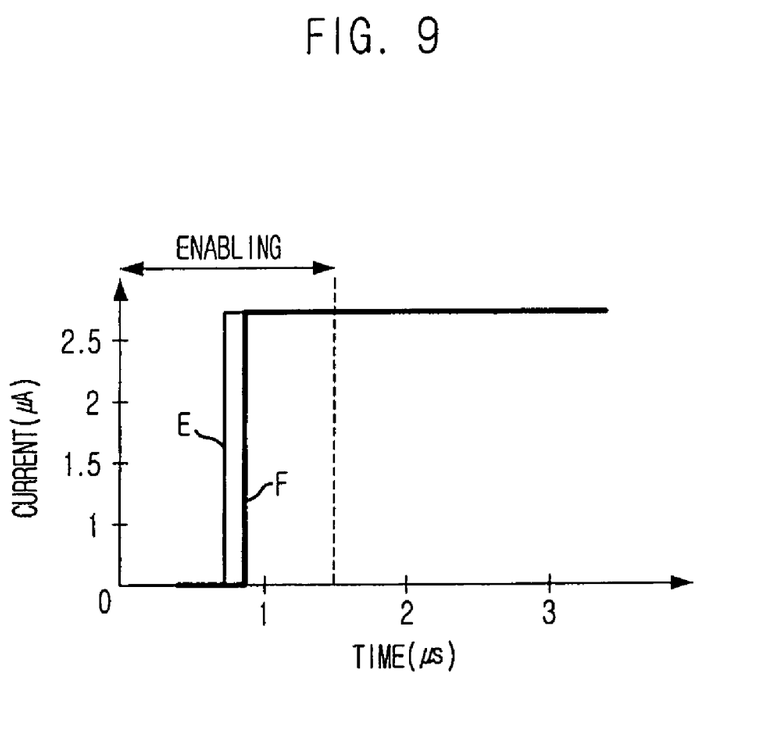
FIG. 9 is a timing diagram showing a simulation result of the system when the input is 2.8 V in accordance with the present invention.

FIG. 9 is a timing diagram showing a simulation result of the system when the input is 2.8 V in accordance with the present invention.

As similar to FIG. 8, two lines E and F denote the power inputted to the comparator and the digital data outputted from the comparator, respectively. In FIG. 9, it is understood that the digital data outputted from the comparator is 1 in case of 2.8 V input.

As described above, in accordance with the present invention, the comparator is configured in a latch structure and uses the enable signal as a control signal instead of the chip power down signal so that the comparator stores the enable signal only for the time being. As a result, since the comparator is automatically turned off after the comparison is completed at the comparator, it is possible to reduce the unnecessary power consumption. Therefore, the inventive chip for operating in multi-power conditions and the system having the same are effective for reducing the power consumption.

The present application contains subject matter related to the Korean patent application No. KR 2005-13582, filed in the Korean Patent Office on Feb. 18, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for controlling an I/O interface of a chip operated in multi-power conditions, comprising:
   an enable signal generator for generating an enable signal based on a chip power down signal;
   a reference voltage generator for generating a predetermined reference voltage in response to the enable signal;
   a comparator for determining a voltage required for operating the chip by comparing an external power voltage with the reference voltage in response to the enable signal; and
   an input/output means for performing an I/O interface function based on the voltage determined according to the comparison result of the comparator.

2. The apparatus of claim 1, wherein the comparator stores the enable signal for a predetermined time and is turned off after the predetermined time.

3. The apparatus of claim 1, wherein the enable signal is generated through an operation on the chip power down signal and a delay signal that the chip power down signal is delayed for a predetermined delay time, the enable signal being activated during the predetermined delay time.

4. The apparatus of claim 3, wherein the enable signal generator includes an AND gate for performing a logic AND operation on the chip power down signal and an inverted delay signal of the chip power down signal.

5. The apparatus of claim 1, wherein the comparator includes:
   a first PMOS transistor of which a gate is controlled by the enable signal, the first PMOS transistor being connected between the power voltage and a first node;
   a second PMOS transistor of which a gate is connected to a second node, the second PMOS transistor being connected to the first PMOS transistor in parallel;
   a third PMOS transistor of which a gate is controlled by the enable signal, the third PMOS transistor being connected between the power voltage and the second node;
   a fourth PMOS transistor of which a gate is connected to the first node, the fourth PMOS transistor being connected to the third PMOS transistor in parallel;
   a first NMOS transistor receiving the external power voltage through a gate thereof, the first NMOS transistor being connected between the first node and the third node;
   a second NMOS transistor receiving the reference voltage through a gate thereof, the second NMOS transistor being connected between the second node and the third node;
   a third NMOS transistor of which a gate is controlled through the enable signal, the third NMOS transistor being connected between the third node and the ground voltage; and
   an inverter for inverting a signal of the first node.

6. The apparatus of claim 5, wherein the inverter includes a fifth PMOS transistor and a fourth NMOS transistor connected to each other in series between the power voltage and the ground voltage, the fifth PMOS transistor and the fourth NMOS transistor receiving the signal of the first node through each gate thereof.

7. The apparatus of claim 1, wherein the reference voltage generator includes:
   a first PMOS transistor of which a gate is controlled by the enable signal, the first PMOS transistor being connected between the power voltage and the first node;
   a second PMOS transistor of which a gate is connected to the first node, the second PMOS transistor being connected between the power voltage and the first node;
   a first NMOS transistor of which a gate is connected to the first node, the first NMOS transistor being connected between the first node and the second node;

a second NMOS transistor of which a gate is controlled by the enable signal, the second NMOS transistor being connected between the second node and the ground voltage;

a third PMOS transistor of which a gate is connected to the first node, the third PMOS transistor being connected between the power voltage and a third node through which the reference voltage is outputted;

a third NMOS transistor of which a gate is connected to the third node, the third NMOS transistor being connected between the third node and a fourth node; and a fourth NMOS transistor of which a gate is connected to the fourth node, the fourth NMOS transistor being connected between the fourth node and the ground voltage.

8. A system comprising:

a power supplier for supplying a multi-power;

a first chip for operating using the power supplied from the power supplier; and a second chip for comparing an internal reference voltage with the power supplied from the power supplier to determine a voltage for the first and the second chips, the second chip operating to interface with the first chip by using the determined voltage, wherein the second chip includes:

an enable signal generator for generating an enable signal using a chip power down signal;

a reference voltage generator for generating a predetermined reference voltage in response to the enable signal;

a comparator for storing the enable signal for a predetermined time and determining a voltage required for operating the chip by comparing the reference voltage with an external power voltage in response to the enable signal during the predetermined time, the comparator being automatically turned off after a lapse of the predetermined time; and an input/output means for performing an interface function using the voltage determined according to the comparison result of the comparator.

9. The system of claim 8, wherein the enable signal is generated through an operation on the chip power down signal and a delay signal that the chip power down signal is delayed for a predetermined delay time, the enable signal being activated during the predetermined delay time.

10. The system of claim 9, wherein the enable signal generator includes an AND gate for performing a logic AND operation on the chip power down signal and an inverted delay signal of the chip power down signal.

11. The system of claim 8, wherein the comparator includes:

a first PMOS transistor of which a gate is controlled by the enable signal, the first PMOS transistor being connected between the power voltage and a first node;

a second PMOS transistor of which a gate is connected to a second node, the second PMOS transistor being connected to the first PMOS transistor in parallel;

a third PMOS transistor of which a gate is controlled by the enable signal, the third PMOS transistor being connected between the power voltage and the second node;

a fourth PMOS transistor of which a gate is connected to the first node, the fourth PMOS transistor being connected to the third PMOS transistor in parallel;

a first NMOS transistor receiving the external power voltage through a gate thereof, the first NMOS transistor being connected between the first node and the third node;

a second NMOS transistor receiving the reference voltage through a gate thereof, the second NMOS transistor being connected between the second node and the third node;

a third NMOS transistor of which a gate is controlled through the enable signal, the third NMOS transistor being connected between the third node and the ground voltage; and an inverter for inverting a signal of the first node.

12. The system of claim 11, wherein the inverter includes a fifth PMOS transistor and a fourth NMOS transistor connected to each other in series between the power voltage and the ground voltage, the fifth PMOS transistor and the fourth NMOS transistor receiving the signal of the first node through each gate thereof.

13. The system of claim 8, wherein the reference voltage generator includes:

a first PMOS transistor of which a gate is controlled by the enable signal, the first PMOS transistor being connected between the power voltage and the first node;

a second PMOS transistor of which a gate is connected to the first node, the second PMOS transistor being connected between the power voltage and the first node;

a first NMOS transistor of which a gate is connected to the first node, the first NMOS transistor being connected between the first node and the second node;

a second NMOS transistor of which a gate is controlled by the enable signal, the second NMOS transistor being connected between the second node and the ground voltage;

a third PMOS transistor of which a gate is connected to the first node, the third PMOS transistor being connected between the power voltage and a third node through which the reference voltage is outputted;

a third NMOS transistor of which a gate is connected to the third node, the third NMOS transistor being connected between the third node and a fourth node; and a fourth NMOS transistor of which a gate is connected to the fourth node, the fourth NMOS transistor being connected between the fourth node and the ground voltage.

* * * * *